United States Patent [19]

Katayama et al.

[11] Patent Number: 5,171,708
[45] Date of Patent: Dec. 15, 1992

[54] METHOD OF BORON DIFFUSION INTO SEMICONDUCTOR WAFERS HAVING REDUCED STACKING FAULTS

[75] Inventors: Masatake Katayama, Takasaki; Shoichi Fujiya, Annaka; Isao Moroga, Annaka; Masaru Shinomiya, Annaka, all of Japan

[73] Assignee: Shin-Etsu Handotai Co., Ltd., Japan

[21] Appl. No.: 736,546

[22] Filed: Jul. 26, 1991

[30] Foreign Application Priority Data

Aug. 22, 1990 [JP] Japan .................. 2-220672

[51] Int. Cl.⁵ .......................................... H01L 21/225
[52] U.S. Cl. ................................... 437/160; 437/949; 437/950; 148/DIG. 37
[58] Field of Search ............... 437/160, 164, 950, 952, 437/949, 10, 12, 247; 148/DIG. 34, DIG. 37, DIG. 38, DIG. 144

[56] References Cited

U.S. PATENT DOCUMENTS 3,997,351 12/1976 Vergano .......................... 437/168
4,734,386 3/1988 Kubota et al. .................... 437/160
4,791,074 12/1988 Tsunashima et al. ............. 437/160

FOREIGN PATENT DOCUMENTS 0104412 4/1984 European Pat. Off. .
2827330 1/1980 Fed. Rep. of Germany ...... 437/160
0092610 5/1985 Japan ................................ 437/160
0092611 5/1985 Japan .

OTHER PUBLICATIONS

Greig et al., "Method of Making Semiconductor Devices", RCA Technical Notes, TN No. 891, 6-71.
Ghandhi, S. K., "VLSI Fabrication Principles", pp. 165-167, 1983.
Solid State Technology, vol. 27, No. 10, Oct. 1984, Washington, US, pp. 153-159; B. H. Justice et al: "A Novel Boron Spin-On Dopand".
RCA Review, vol. 28, No. 2, Jun. 1967, "Princeton US", pp. 344-350; N. Goldsmith et al: Boron Nitride As A Diffusion Source For Silicon p. 346, paragraph 4-p. 347, last paragraph.

Primary Examiner—Brian E. Hearn
Assistant Examiner—C. Chaudhari
Attorney, Agent, or Firm—Nikaido, Marmelstein, Murray & Oram

[57] ABSTRACT

A method of diffusing boron into semiconductor wafers is disclosed which essentially includes boron deposition and boron diffusion. The deposition is performed from 900° to 1,000° C. and the diffusion at a temperature of 890° to 1000° C. Oxidation induced stacking faults are greatly reduced.

4 Claims, 2 Drawing Sheets

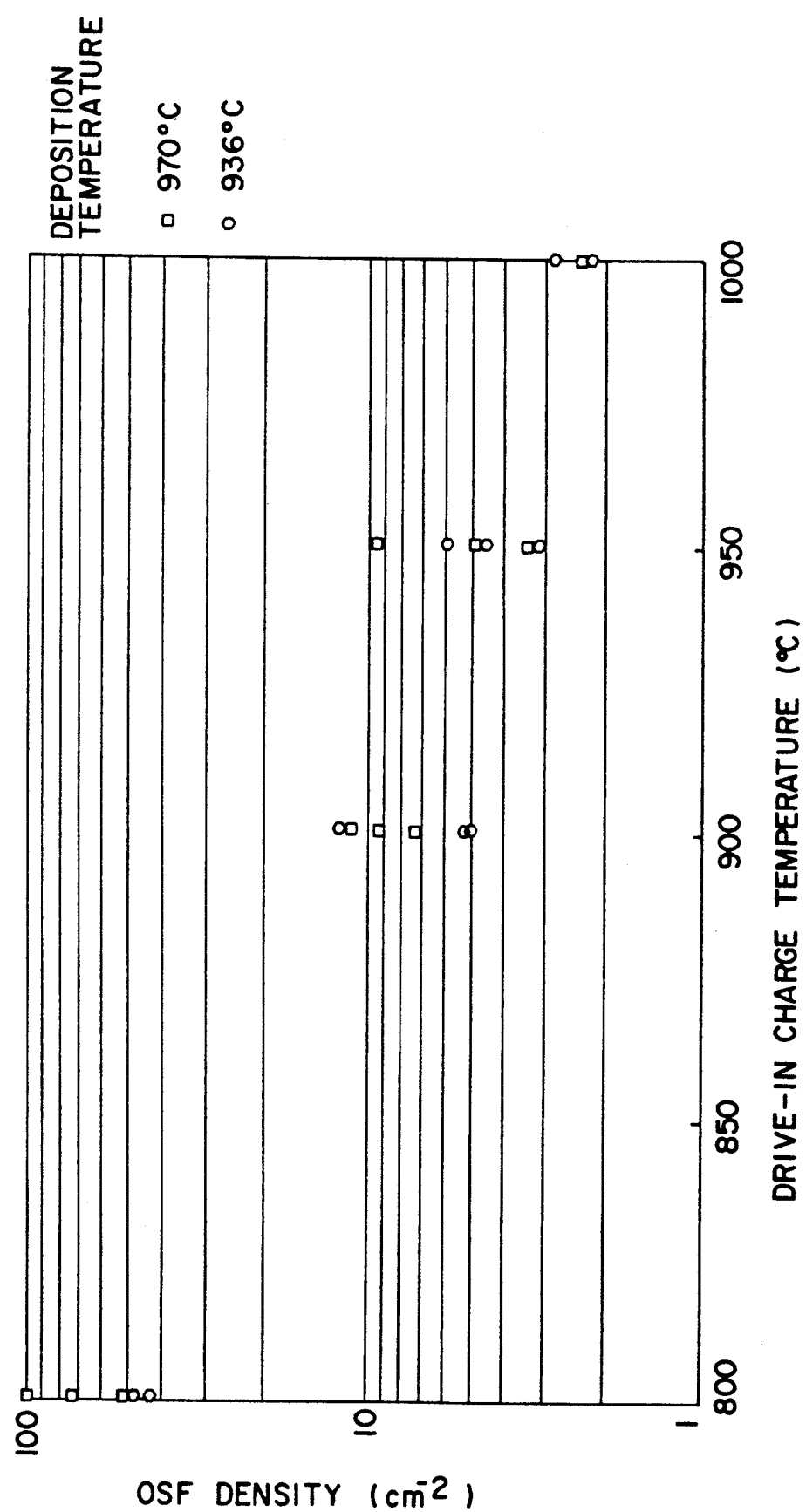

METHOD OF BORON DIFFUSION INTO SEMICONDUCTOR WAFERS HAVING REDUCED STACKING FAULTS

BACKGROUND OF THE INVENTION

1. Field of the Invention

The present invention relates to a method of diffusing boron into semiconductor wafers with oxidation induced stacking faults kept to an absolute minimum.

2. Description of the Prior Art

Boron nitrides (BN) and polyboron films (PBF) are known as boron sources for use in the boron diffusion of transistor base regions.

In the case where a BN source is employed, a semiconductor wafer is disposed on boats in contact at both sides of the boron source, followed by heating in a diffusion furnace. Boron oxide ($B_2O_3$), generated with heat on the surface of BN, is allowed to fly over the wafer so that glass and diffusion layers of boron, both layers of high concentrations and uniform thicknesses, are formed on the wafer. The boron glass layer is then removed by etching, whereas the boron diffusion layer is oxidized again in the furnace at a relatively low temperature of 700° C. after which the resulting contamination layer is etched from the boron diffusion layer. Subsequently, a boron diffusion step commonly termed a drive-in step is carried out during the heating in the furnace.

The above mode of boron diffusion with a BN source is not wholly satisfactory as, due to $B_2O_3$ on BN being necessarily subject to flying over the wafer and hence likely to be affected by a gaseous stream in the furnace, sheet resistance is variable or irregular and difficult to control. As another but serious problem, this prior boron diffusion technique is susceptible to oxidation induced stacking faults (OSF) as many as 100 pieces/$cm^2$ or greater. OSF densities of not more than 20 pieces/$cm^2$ are regarded as critical and acceptable in the art.

PBF permits direct application or coating over a semiconductor wafer, forming $B_2O_3$ and boron glasses of uniform thicknesses with uniform magnitudes of sheet resistance. Moreover, it is by nature easy to handle. PBF has been reputed as a good boron source as taught for instance in Japanese Patent Publication No. 1-60932 and Japanese Patent Laid-open Publication No. 60-92610. This film leaves, despite those advantages, the problem that it involves OSF in a density of more than 100 pieces/$cm^2$.

The foregoing drawbacks of the prior art have lent an impetus to the provision of means which will enable OSF densities to be reduced in the boron diffusion of semiconductor wafers.

SUMMARY OF THE INVENTION

The present invention seeks to provide a method of diffusing boron into semiconductor wafers which ensures a reduction in of objectionable OSF to a critical limit of less than 20 pieces/$cm^2$.

The boron diffusion method of this invention is suitable particularly for use in semiconductor wafers of greater than 5 inches in diameter.

More specifically, the invention provides a method of diffusing boron into semiconductor wafers which comprises applying a boron source onto a semiconductor wafer, calcining the source at a temperature from 450° to 800° C. and in an oxygen atmosphere of lower than 20% by volume in concentration, performing boron deposition at a temperature from 900° to 1,000° C. and in a nitrogen atmosphere, removing boron glass layer from the semiconductor wafer, and thereafter effecting boron diffusion at a charge temperature of 890° to 1000° C.

Many other objects, advantages and features of the present invention will be better understood from the following description taken in conjunction with the accompanying drawings.

BRIEF DESCRIPTION OF THE DRAWINGS

FIG. 2 graphically represents the correlation between the OSF densities and the charge temperatures at the drive-in step with respect to a certain semiconductor wafer resulting from testing the method of this invention.

DETAILED DESCRIPTION OF THE INVENTION

Figure 1:
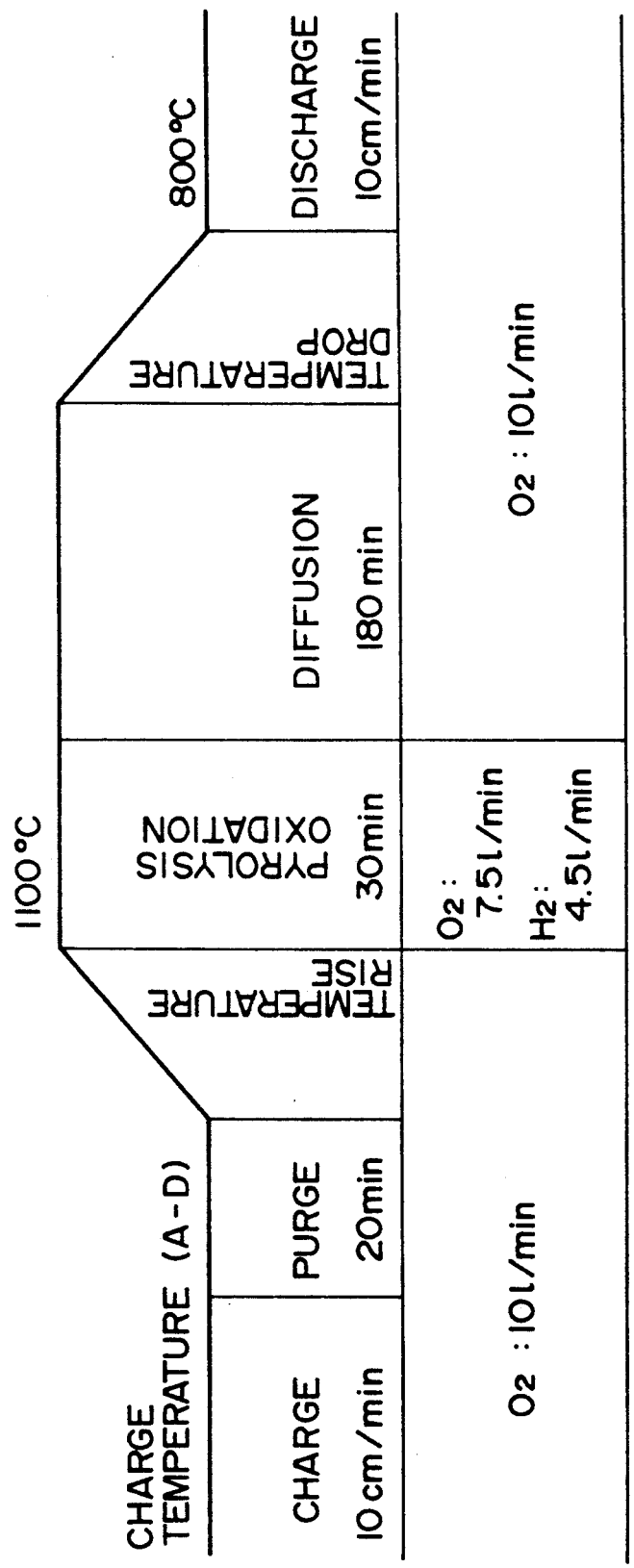
FIG. 1 is a diagrammatical view explanatory of the heat-treating conditions at a drive-in step according to the present invention.

To implement the boron diffusion method according to the present invention, a boron source is applied or coated onto a semiconductor wafer and calcined at a temperature of 450° to 800° C. and in an oxygen atmosphere. The concentration of oxygen may preferably be not more than 20% by volume. A boron deposition step is thereafter performed from 900° to 1,000° C. and in a nitrogen atmosphere, removing a boron glass layer formed on the wafer, after which a boron diffusion or drive-in step is finally effected within a specific range of temperatures.

According to one important aspect of the present invention, the drive-in step should be done at a charge temperature set to be substantially equal to or higher than the temperature at the deposition step. The charge temperature should range from 890° to 1,000° C., preferably from 900° to 950° C. This temperature if higher than 1,000° C. would, though causing a sufficient reduction in OSF, adversely result in a considerable amount of slippage. If lower than 890° C. the temperature and thus the process would not be effective in inhibiting or reducing OSF.

Strict observance of 890° to 1,000° C. as the charge temperature, particularly of 900° to 950° C., contributes greatly to the avoidance of slip and also to the full reduction of OSF.

Boron sources usable for the purposes of the invention are PBF and BN of which PBF is more feasible for its handling convenience.

The invention will now be described by way of the following examples which should be construed as illustrative rather than restrictive.

Performance evaluations were made, under the test conditions given below, of the effects of both deposition and diffusion temperatures upon the OSF densities.

Semiconductor Wafer
5-inch CZP type 100 and type 111
20 Ω·cm
PBF
6M-10, product of Tokyo Applied Chemicals Co.
spin coating at 4,700 rpm
Calcination and Deposition in Diffusion Furnace
calcination at 700° C. in 5% $O_2/N_2$ by volume for -continued 30 min
deposition in N$_2$ for 30 min at two different
temperatures of 936° C. and 970° C.

Boron Glass Removal 1 min with 5% by weight hydrofluoric acid

Drive-In in Diffusion Furnace

| lot | charge temperature (°C.) |
|-----|--------------------------|
| A | 800 |
| B | 900 |
| C | 950 |
| D | 1,000 |

FIG. 1 is taken to refer to the heat-treating conditions at a drive-in step according to the invention.

The test wafer, after being heat-treated in the drive-in step, was HF-treated to remove therefrom an oxidized film, followed by light etching for one minute. Counting of the OSF/cm$^2$ was done by means of a 100-magnification, optical microscope with the results shown in FIG. 2.

The test results have led to the following findings.

1. The OSF density depends solely upon the temperature at the drive-in step, revealing a decline as the charge temperature rises within the test range from 800° to 1,000° C.

2. The OSF density is immune from the dependence on the deposition temperatures from 936° to 970° C.

3. With the charge temperature chosen from 890° to 1,000° C., the OSF density is reduced conspicuously to 20 pieces/cm$^2$ or below.

4. The temperature at the drive-in step is selected to be substantially equal to or higher than the deposition step so that the OSF density can be held at an acceptable level of not beyond 20 pieces/cm$^2$.

Although PBF is illustrated as the boron source, BN may suitably be used with a minimum of OSF densities as in the PBF source. In such an instance, the charge temperature at the drive-in step should of course be set within the range specified above.

What is claimed is:

1. A method of diffusing boron into semiconductor wafers, comprising the steps of:
   (a) applying a boron source into a semiconductor wafer;
   (b) calcining the source at a temperature from 450° to 800° C. and in an oxygen atmosphere of lower than 20% by volume in concentration;
   (c) performing boron deposition at a temperature from 900° to 1,000° C. and in a nitrogen atmosphere;
   (d) removing a boron glass layer from the wafer; and
   (e) thereafter, effecting boron diffusion at a drive-in charge temperature of 890° to 1,000° C.

2. A method according to claim 1, wherein the boron source is a polyboron film or a boron nitride.

3. An method according to claim 1, wherein the drive-in charge temperature is in the range from 900° to 950° C.

4. An method according to claim 2, wherein the boron source is a polyboron film.

* * * * *